(12) United States Patent
Hong et al.

(10) Patent No.: US 6,924,072 B2
(45) Date of Patent: Aug. 2, 2005

(54) METHOD FOR EXPOSING A PERIPHERAL AREA OF A WAFER AND APPARATUS FOR PERFORMING THE SAME

(75) Inventors: Hyung-Sik Hong, Yongin-si (KR); Dong-Wha Shin, Yongin-si (KR); Byung-Ho Min, Yongin-si (KR); Jae-Hong Choi, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/883,712

(22) Filed: Jul. 6, 2004

(65) Prior Publication Data

US 2004/0241886 A1 Dec. 2, 2004

Related U.S. Application Data

(62) Division of application No. 10/090,807, filed on Mar. 6, 2002, now Pat. No. 6,795,162.

(30) Foreign Application Priority Data

Mar. 6, 2001 (KR) ......................................... 2001-11540

(51) Int. Cl.⁷ ................................................. G03F 9/00
(52) U.S. Cl. .......................... 430/30; 430/22; 356/399; 356/400
(58) Field of Search ..................... 430/22, 30; 356/399, 356/400

(56) References Cited

U.S. PATENT DOCUMENTS

| | | | |
|---|---|---|---|
| 4,899,195 A | 2/1990 | Gotoh | 346/155 |
| 5,194,743 A | 3/1993 | Aoyama et al. | 250/548 |
| 5,361,121 A | 11/1994 | Hattori et al. | 355/50 |
| 5,811,211 A * | 9/1998 | Tanaka et al. | 430/30 |
| 5,880,816 A | 3/1999 | Mimura et al. | 355/53 |
| 5,929,976 A | 7/1999 | Shibuya et al. | 355/53 |
| 6,042,976 A * | 3/2000 | Chiang et al. | 430/22 |
| 6,593,045 B2 * | 7/2003 | Sato et al. | 430/30 |
| 6,707,535 B2 * | 3/2004 | Sato et al. | 355/53 |
| 6,721,037 B2 * | 4/2004 | Nagai et al. | 355/53 |
| 6,722,798 B2 * | 4/2004 | Senba et al. | 396/611 |

FOREIGN PATENT DOCUMENTS

| | | |
|---|---|---|
| KR | 1997-0063424 | 9/1997 |
| KR | 2001-0002876 | 1/2001 |
| KR | 2001-0062359 | 7/2001 |

* cited by examiner

Primary Examiner—Christopher G. Young
(74) Attorney, Agent, or Firm—Lee & Morse, P.C.

(57) ABSTRACT

A method and an apparatus for precisely exposing a predetermined width of a peripheral area of a wafer coated with a layer of photoresist material with light from a light source, wherein the wafer is moved when the light is radiated onto the wafer to expose the photoresist layer at the peripheral area of the wafer, an inspection section inspecting whether the light is radiated onto a precise position of the peripheral area of the wafer, whereby by adjusting the position of the light source if the light is not radiated at the precise position of the peripheral area of the wafer requiring exposure while inspecting the light radiated onto the peripheral area of the wafer, the predetermined width of the peripheral area of the wafer is precisely exposed.

10 Claims, 10 Drawing Sheets

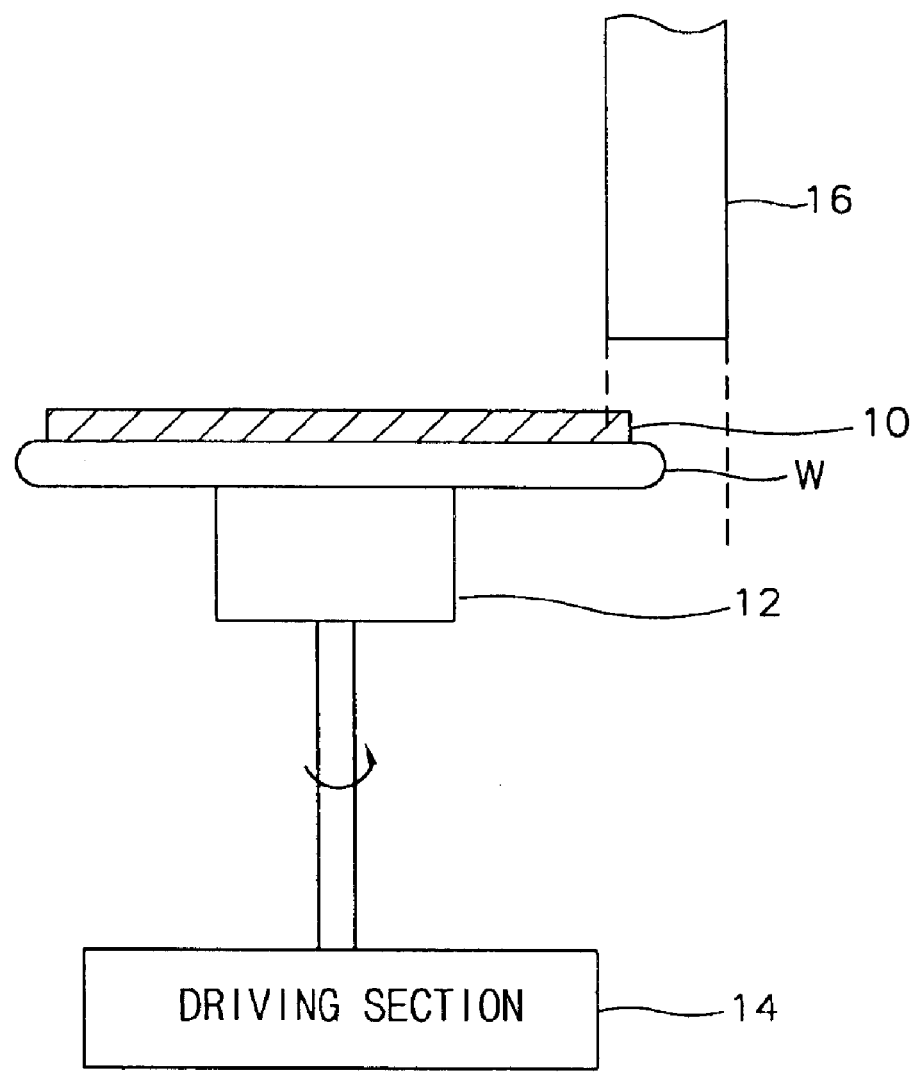

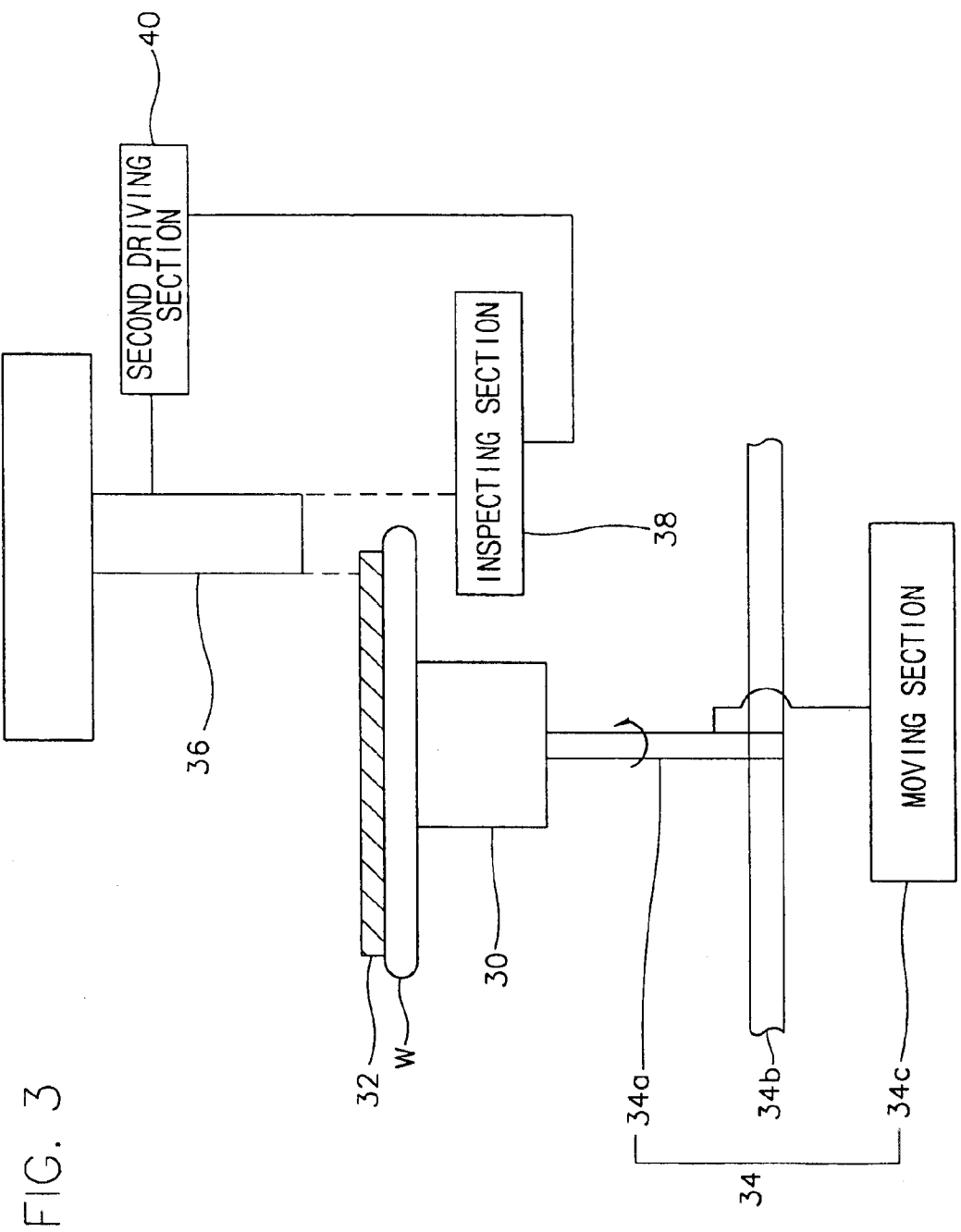

METHOD FOR EXPOSING A PERIPHERAL AREA OF A WAFER AND APPARATUS FOR PERFORMING THE SAME

This application is a divisional of U.S. application Ser. No. 10/090,807 filed Mar. 6, 2002, now U.S. Pat. No. 6,795,162.

BACKGROUND OF THE INVENTION

1. Field of the Invention

The present invention relates to a method for exposing a peripheral area of a wafer and an apparatus for performing the same. More particularly, the present invention relates to a method for precisely exposing a wafer by a predetermined width from a peripheral area to a predetermined inner portion of the wafer coated with photoresist and an apparatus for performing the method.

2. Description of the Related Art

As electronic information media devices, such as computers, become more widely used, semiconductor technology also becomes widely used. From a functional aspect, a semiconductor device is required to operate at a high speed with a large storing capacitance. Accordingly, semiconductor technology has made great strides recently to develop and improve the degree of integration as well as increase reliability and response speed of semiconductor devices. Accordingly, in the field of semiconductor technology, techniques for improving the degree of integration in semiconductor devices, such as photolithographic techniques, which are used as fine processing techniques in manufacturing semiconductor wafers are critical in meeting the current strict requirements and demands in semiconductor manufacture.

As is well known in the field of photolithography technique, a photoresist film is formed on the wafer on which films for forming patterns are deposited. Then, a predetermined portion of the photoresist pattern is removed by exposure and developing processes so that the photoresist pattern is formed on the wafer.

The photoresist film is made of a photosensitive polymer material. The photosensitive polymer material is subject to a chemical reaction by the light, so the solubility of the photoresist polymer material is changed. That is, when the wafer formed with the photoresist film is exposed to the light through a photo mask provided with fine circuits, the chemical reaction selectively occurs in a predetermined portion of the photoresist film, on which the light is radiated, so that the predetermined portion of the photoresist film is changed to non-soluble material or the solubility thereof is increased as compared with solubility of the other part of the photoresist film. By developing the photoresist film using a film developer, the photoresist pattern is formed. The photoresist pattern may be used as a mask when an etching process or an ion implanting process is carried out.

The photo mask is fabricated such that the photoresist pattern may be formed on a chip area of the wafer. Therefore, a peripheral area of the wafer, in which the chip is not formed, has no photoresist patterns. If the photoresist pattern is formed by using a positive photoresist, which is changed to the soluble material when the light is radiated thereon, the photoresist still remains in the peripheral area of the wafer after the wafer has been developed, since the peripheral area of the wafer is not exposed to the light. The photoresist remaining in the peripheral area of the wafer frequently makes contact with a wafer chuck or a teaser, so the wafer may be contaminated by the photoresist. For this reason, a side rinse process is carried out by spraying a cleaning liquid, such as acetone, on the peripheral area of the wafer to remove the photoresist from the peripheral area of the wafer when the photoresist is coated on the wafer. However, the side rinse process is not capable of completely removing the photoresist remaining in the peripheral area of the wafer.

In an effort to solve at least the above problem, the peripheral area of the wafer is separately exposed and developed after the photoresist pattern is formed on the wafer coated with the photoresist, thereby removing the photoresist from the peripheral area of the wafer.

FIG. 1 illustrates a conventional exposure device for exposing a peripheral area of a wafer.

Referring to FIG. 1, the exposure device for exposing a peripheral area of a wafer has a wafer chuck 12 on which the wafer W formed with a photoresist pattern 10 is loaded. The wafer chuck 12 has a size smaller than a size of the wafer W. A driving section 14 is operatively associated with the wafer chuck 12 to horizontally and rotatably drive the wafer chuck 12. A light source 16 is fixedly installed above the wafer W to radiate the light toward the peripheral area of the wafer W.

In order to expose the entire peripheral area of the wafer W using the conventional exposure device, the wafer is moved by driving section 14 while the light is radiated onto the peripheral area of the wafer W from the light source 16 until the entire peripheral area of the wafer W is exposed to the light.

More particularly, the wafer W formed with the photoresist pattern 10 is loaded on the wafer chuck 12. Then, the light is radiated on a predetermined portion of the peripheral area and an outer area beyond an edge portion of the wafer W. The light is radiated onto the wafer W such that the photoresist film 10 formed on the peripheral area of the wafer W may be exposed to the light.

While the light is being radiated onto the wafer W, the wafer chuck 12 is driven to move the wafer W in such a manner that a predetermined portion of the photoresist film 10 formed on the peripheral area of the wafer W is exposed to the light. The wafer chuck 12 is horizontally driven parallel to a flat zone of the wafer W when the light is radiated onto the flat zone of the wafer W, and is rotatably driven when the light is radiated onto the peripheral area of the wafer W.

However, the above method cannot precisely expose the predetermined portion of the peripheral area of the wafer W. That is, in order to precisely expose the predetermined portion of the peripheral area of the wafer W while rotating the wafer W, a center of the wafer W must precisely match a center of the wafer chuck 12. In addition, the wafer chuck 12 must be horizontally maintained while the rotational operation is being carried out. However, the tolerance may be exceeded when the wafer W is loaded on the wafer chuck 12 by a robot arm or when the wafer chuck 12 is rotated, so precise exposure is difficult.

FIG. 2A illustrates a top plan view of a wafer that has been correctly exposed to the light. FIG. 2B illustrates a top plan view of a wafer that has been incorrectly exposed to the light.

The wafer W shown in FIG. 2A has exposed portions 20a and 20b having uniform widths in the peripheral area of the wafer W. However, the wafer W as shown in FIG. 2B has not been uniformly exposed to the light so that widths of exposed portions 20c and 20d of the peripheral area of the wafer W are unevenly formed.

The large width of exposed portion 20d of the wafer shown in FIG. 2B may cause failure of a main chip since a portion of the photoresist pattern formed on the main chip is exposed to the light. In addition, particles may be generated by the photoresist remaining in an area of the exposed portion 20c, thereby also resulting in failure of the chip.

SUMMARY OF THE INVENTION

The present invention has been made to solve at least some of the problems of the prior art. Accordingly, it is a feature of an embodiment of the present invention to provide a method for precisely exposing a predetermined portion of a peripheral area of a wafer coated with photoresist.

Another feature of an embodiment of the present invention is to provide an apparatus for performing the method.

To provide the first feature of the present invention, there is provided a method for exposing a peripheral area of a wafer as follows: a photoresist film formed on a peripheral area of a wafer is exposed by radiating a light toward the peripheral area of the wafer while moving the wafer; whether the light is uniformly radiated onto the predetermined width of the peripheral area of the wafer is inspected when the exposing is carried out; and a position of the light to be radiated onto the peripheral area of the wafer is adjusted if the light deviates from the predetermined width of the peripheral area of the wafer.

To provide the second feature of the present invention, there is provided an apparatus for exposing a peripheral area of a wafer. The apparatus includes a wafer chuck on which a wafer formed with a photoresist film is loaded; a first driving section operatively associated with the wafer chuck to drive the wafer chuck; a light source installed above the peripheral area of the wafer to generate light; an inspecting section for inspecting whether the light is precisely radiated from the light source onto the peripheral area of the wafer; and a second driving section operatively associated with both the inspecting section and the light source to drive the light source in such a manner that the light is precisely radiated on the peripheral area of the wafer.

According to the present invention, the photoresist film formed on the peripheral area of the wafer is exposed by radiating the light onto the peripheral area of the wafer while moving the wafer. In addition, the position of the light source is adjusted while inspecting the light radiated onto the peripheral area of the wafer, so that the predetermined width of the peripheral area of the wafer may be precisely exposed.

BRIEF DESCRIPTION OF THE DRAWINGS

The above features and advantages of the present invention will become more apparent by describing in detail preferred embodiments thereof with reference to the attached drawings in which:

FIG. 1 illustrates a conventional apparatus for exposing a peripheral area of a wafer;

FIG. 3 is a schematic diagram illustrating an apparatus for exposing a peripheral area of a wafer according to a first embodiment of the present invention;

DETAILED DESCRIPTION OF THE INVENTION

Figure 2A:
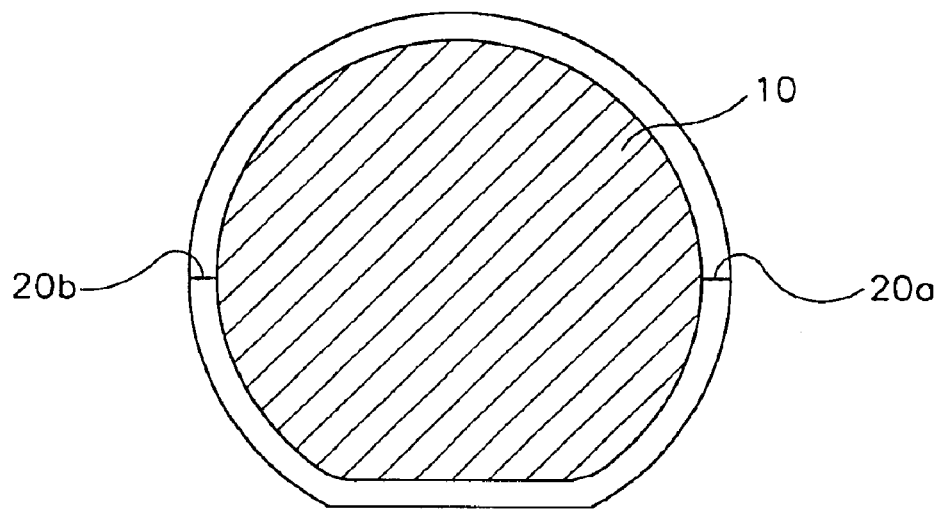
FIGS. 2A and 2B illustrate top plan views of wafers, which are correctly and incorrectly exposed to light, respectively.
Figure 2B:
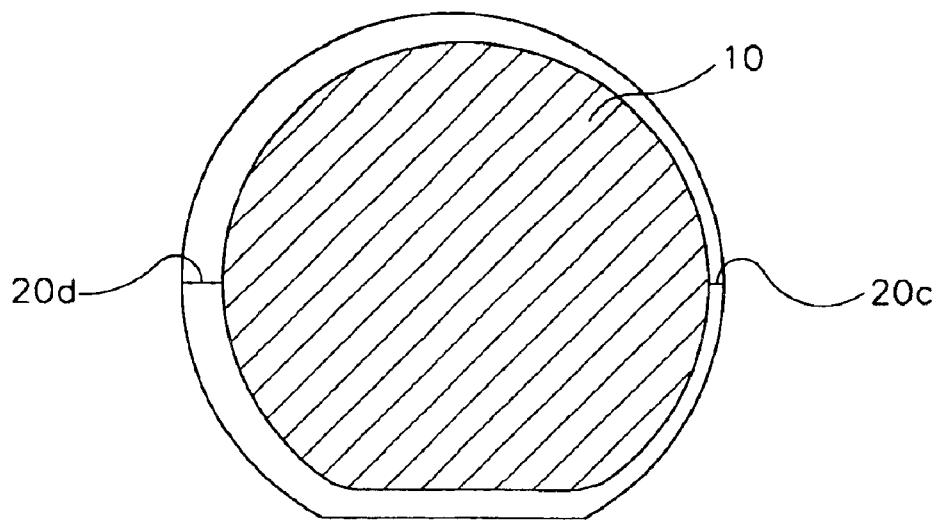

Korean Patent Application No. 2001-11540, filed Mar. 6, 2001, and entitled: "Method for Exposing a Peripheral Area of a Wafer and Apparatus for Performing Same," is incorporated by reference herein in its entirety.

Hereinafter, preferred embodiments of the present invention will be described in detail with reference to the accompanying drawings.

FIG. 3 is a schematic diagram illustrating an apparatus for exposing a peripheral area of a wafer according to a first embodiment of the present invention.

Referring to FIG. 3, a wafer W is loaded on a wafer chuck 30. The wafer W loaded on the wafer chuck 30 is formed with a photoresist film 32. The photoresist film 32 is exposed through a photo mask having fine circuits so that a photoresist pattern is formed on the upper portion of the wafer W. When the photoresist film 32 is formed on the upper portion of the wafer W, a side rinse is carried out by injecting a cleaning liquid including acetone toward the peripheral area of the wafer W, so that the photoresist formed on the peripheral area of the wafer W is removed. The wafer chuck 30 has a size smaller than a size of the wafer W loaded thereon.

A first driving section 34 is operatively associated with the wafer chuck 30 to drive the wafer chuck 30. The first driving section 34 has a rotating shaft 34a that supports a lower portion of the wafer chuck 30 and rotates the wafer chuck 30. A rail 34b is coupled to a lower portion of the rotating shaft 34a. The rail 34b provides a route for moving the wafer chuck 30 in a direction parallel to a flat zone of the wafer W loaded on the wafer chuck 30. A moving section 34c is operatively associated with the rotating shaft 34a to drive the rotating shaft 34a in a direction parallel to the flat zone of the wafer W by way of the rail 34b.

A light source 36 is installed above the peripheral area of the wafer W loaded on the wafer chuck 30. The light source 36 is positioned such that light generated by the light source 36 is radiated over the peripheral area of the wafer W and an outer area beyond an edge portion of the wafer W.

An inspecting section 38 is provided to inspect whether the light generated by the light source 36 is precisely radiated along a predetermined width of the peripheral area of the wafer W. In addition, a second driving section 40 is operatively associated with both the inspecting section 38 and the light source 36 to drive the light source 36.

Figure 4:
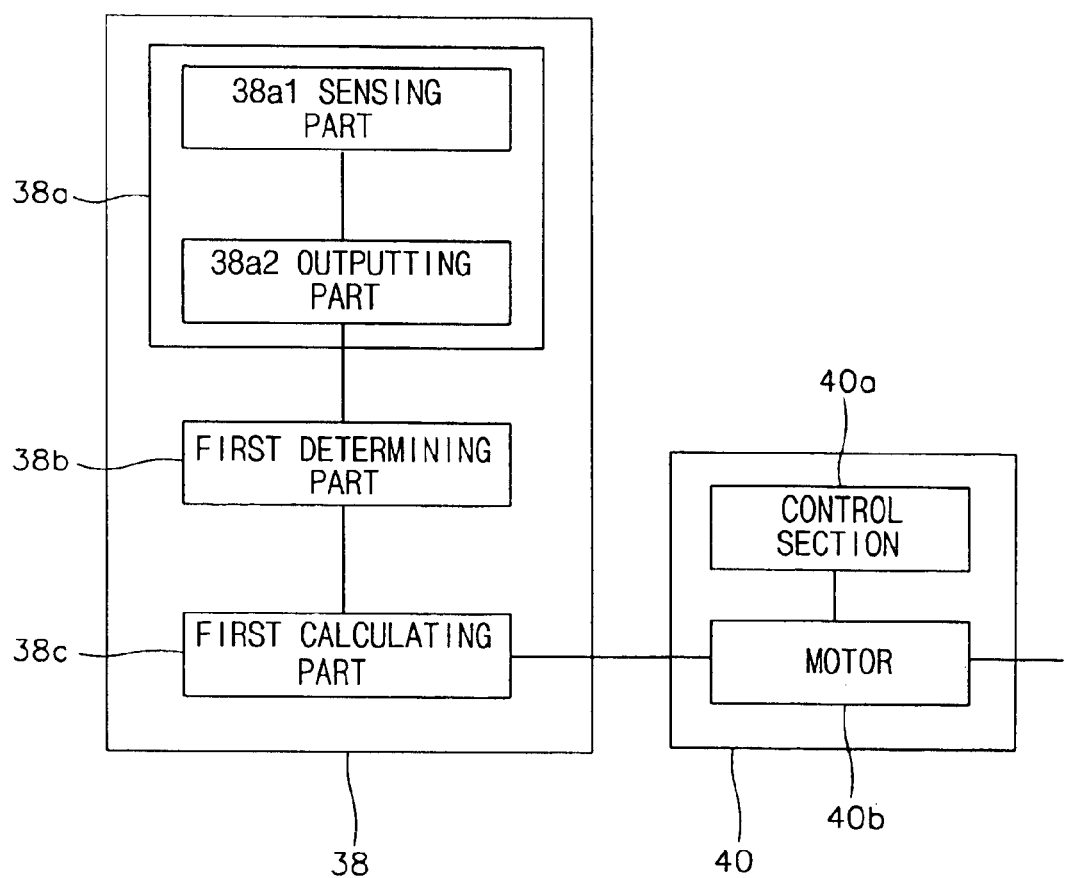
FIG. 4 is a block diagram illustrating the construction of an inspecting section and a second driving section of the apparatus shown in FIG. 3.

FIG. 4 is a block diagram illustrating the construction of the inspecting section 38 and the second driving section 40 of the apparatus shown in FIG. 3.

Referring to FIG. 4, the inspecting section 38 includes a first detecting part 38a installed remote from a rear surface of the peripheral area of the wafer W for detecting the light radiated toward the outer area beyond the peripheral edge portion of the wafer W and outputting an optical datum of the detected light. The first detecting part 38a includes a sensing part 38a1 for sensing an intensity of radiation of the light radiated toward the outer area beyond the peripheral edge portion of the wafer W. The optical datum of the detected light is based on the intensity of the radiation of the light as sensed by the sensing part 38a1 and as outputted by the outputting part 38a2. A first determining part 38b is provided to receive the optical datum from the first detecting part 38a. The first determining part 38b compares the optical datum with a reference optical datum to determine whether the optical datum is within a predetermined, allowable range of values. The reference optical datum is predetermined as an optical datum that is detected by the first detecting part 38a when the predetermined width of the peripheral area of the wafer W is uniformly exposed to the light. In addition, a first calculating part 38c is operatively associated with the first determining part 38b. The first calculating part 38c receives an error value of the optical datum from the determining part 38b to calculate a position of the light to be radiated and a position datum of the light source for precisely radiating the light to the position.

When a predetermined width of the peripheral area of the wafer is uniformly exposed, the intensity of radiation of the light radiated towards the outer area beyond the edge portion of the wafer W is constantly maintained. Therefore, the position datum of the light source 36, which is a distance to be moved to an inner or outer direction of the wafer W from the position of the light source 36, may be calculated based on the error value between the intensity of radiation of the detected light with a reference intensity of radiation of the light and the error value thereof.

The second driving section 40, which is operatively associated with both inspecting section 38 and the light source 36 to drive the light source 36, is coupled to a motor 40b to horizontally move the light source 36 in an inner or an outer direction of the wafer W loaded on the wafer chuck 30. In addition, a control section 40a is provided to control the operation of the motor 40b based on the position datum inputted from the inspecting section 38.

Accordingly, the apparatus is able to precisely expose a predetermined width of the peripheral area of the wafer W by moving the light source 36 using the second driving section 40.

Hereinafter, a method for exposing the peripheral area of the wafer W by using the apparatus shown in FIG. 3 will be described.

Figure 5:
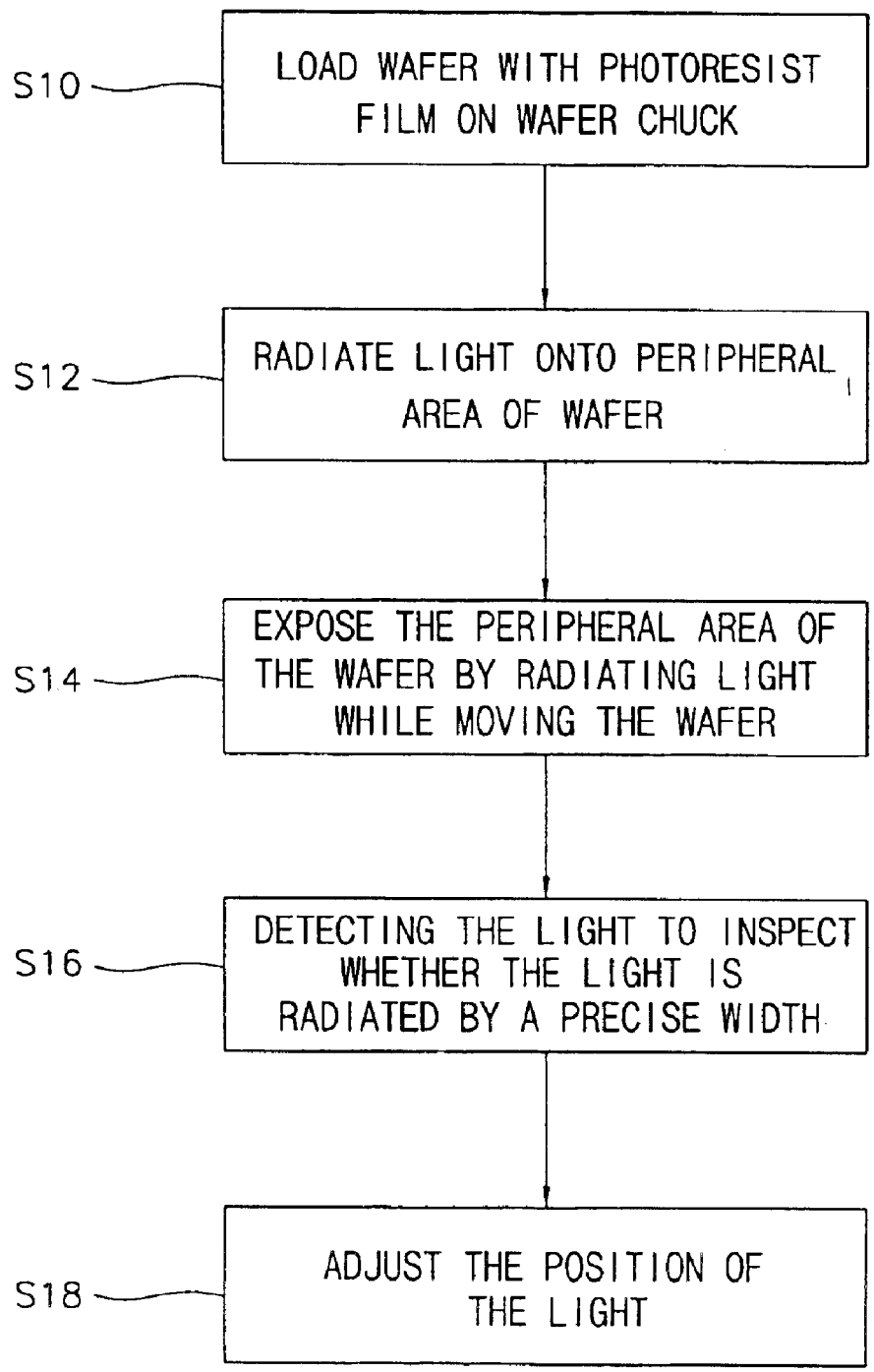
FIG. 5 is a flow chart illustrating method steps for exposing the peripheral area of a wafer according to the first embodiment of the present invention.

FIG. 5 is a flow chart illustrating method steps for exposing the peripheral area of a wafer according to a first embodiment of the present invention.

Referring to FIGS. 3, 4 and 5, a photoresist film 32 is formed on wafer W. In step S10, the wafer W is loaded on the wafer chuck 30, which is horizontally and rotatably driven. In step S12, the light is radiated onto a predetermined portion of the peripheral area of the wafer W loaded on the wafer chuck 30. The light is radiated from the light source 36 over the peripheral area and the outer area beyond an edge portion of the wafer W. In addition, the light source 36 is positioned such that the predetermined width of the peripheral area of the wafer W is exposed to the light when a center of the wafer W matches a center of the wafer chuck 30.

In step S14, the photoresist film 32 formed on the peripheral area of the wafer W is exposed by radiating the light from the light source 36 while moving the wafer W by driving the wafer chuck 30. That is, when the light is radiated onto a flat zone of the wafer W, the wafer chuck 30 moves in a direction parallel to the flat zone of the wafer W. Accordingly, the light is radiated onto the wafer W along the flat zone of the wafer W by a predetermined width so that the photoresist film 32 formed on the flat zone of the wafer W is exposed. In addition, when the light is radiated onto the peripheral area of the wafer W except for the flat zone of the wafer W, the wafer chuck 30 is rotated. Accordingly, the light is radiated along a predetermined width of the peripheral area of the wafer W so that the photoresist film 32 formed on the peripheral area of the wafer W is exposed.

In step S16, when the peripheral area of the wafer W is exposed while driving the wafer chuck 30, the inspecting section 38 detects the light radiated toward the outer area beyond the edge portion of the wafer W and inspects whether the light is radiated onto the predetermined width of the peripheral area of the wafer W. More particularly, the first detecting part 38a detects the light radiated toward the outer area beyond the edge portion of the wafer W and outputs the optical datum thereof. The optical datum is an intensity of radiation of the detected light. In addition, the first determining part 38b receives the optical datum from the first detecting part 38a. When the predetermined width of the peripheral area of the wafer W is uniformly exposed, the first determining part 38b compares the optical datum detected by the first detecting part 38a with a reference optical datum to determined whether the optical datum is within a predetermined, allowable range of values. The first calculating part 38c then calculates the precise position datum of the light to be radiated based on the error value inputted from the first determining part 38b.

If the outputted optical datum is larger than the reference optical datum, the width of the peripheral area of the wafer W, to which the light is radiated, is narrowed. If the outputted optical datum is smaller than the reference optical datum, the width of the peripheral area of the wafer W is extended or widened. Accordingly, in order to radiate the light onto a predetermined width of the peripheral area of the wafer precisely, the distance datum for horizontal movement of the light source 36 in the inner or outer direction of the wafer W is calculated based on the error value obtained by the first determining part 38b.

In step S18, if the light radiated onto the peripheral area of the wafer W does not match the predetermined width, the position of the light is adjusted by moving the position of the light source 36. That is, the control section 40a of second driving section 40 receives the calculated position datum and drives the motor 40b based on the position datum to horizontally move the light source 36 in the inner or outer direction of the wafer W.

Figure 6:
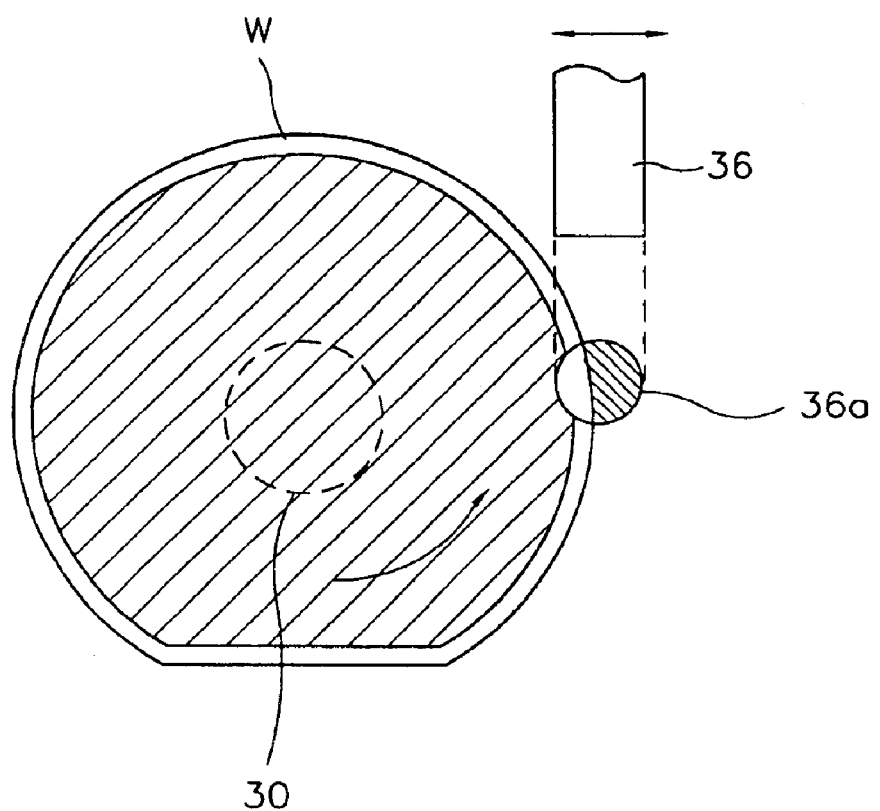
FIG. 6 illustrates a top plan view of a wafer illustrating a method for exposing the peripheral area of the wafer using the apparatus shown in FIG. 3.

FIG. 6 illustrates a top plan view of a wafer illustrating method steps for exposing the peripheral area of the wafer by using the apparatus shown in FIG. 3.

Referring to FIG. 6, the wafer chuck 30 is driven to expose the peripheral area of the wafer W loaded thereon while the light is radiated from the light source 36 onto the peripheral area of the wafer W. At this time, the optical datum of the light 36a radiated toward the outer area beyond the edge portion of the wafer W is detected and the light source 36 is horizontally moved in the inner or outer direction of the wafer W based on the optical datum.

Accordingly, the predetermined width of the peripheral area of the wafer W may be precisely exposed by moving the position of the light source 36 even when the wafer W is not accurately positioned on the wafer chuck 30 or a tolerance is exceeded when the wafer chuck 30 is rotated.

Figure 7:
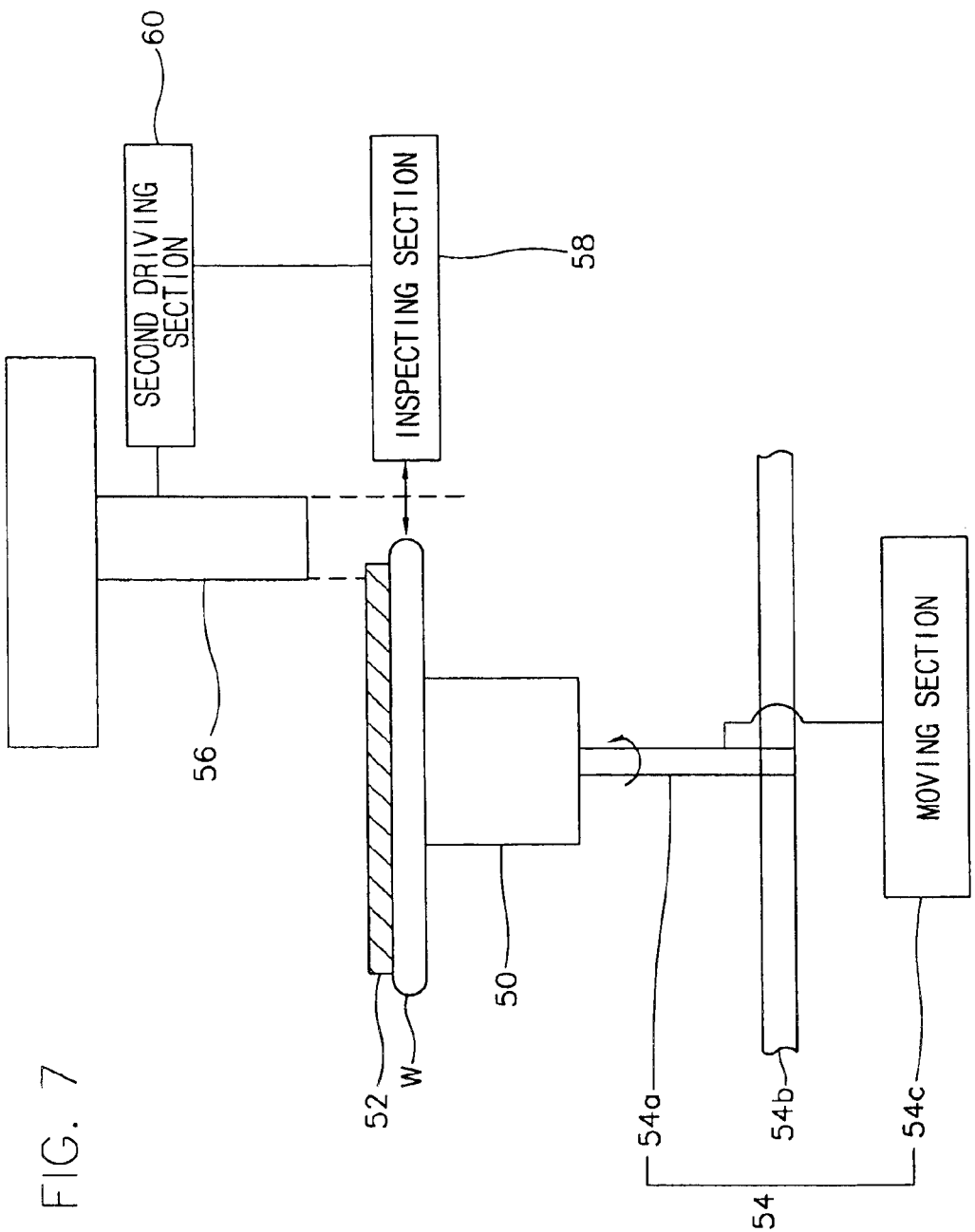
FIG. 7 is a schematic diagram illustrating an apparatus for exposing a peripheral area of a wafer according to a second embodiment of the present invention.

FIG. 7 is a schematic diagram illustrating an apparatus for exposing a peripheral area of a wafer according to a second embodiment of the present invention.

The method and apparatus of the second embodiment is similar to the method and apparatus of the first embodiment shown in FIGS. 3 to 5, except for an addition of an inspecting section for inspecting whether the light is precisely radiated onto the peripheral area of the wafer. Hereinafter, an apparatus according to the second embodiment of the present invention will be described with reference to FIG. 7.

The apparatus according to the second embodiment of the present invention has a wafer chuck 50 on which the wafer W coated with a photoresist film 52 is loaded, including a first driving section 54, a rotating shaft 54a installed at a center of a lower portion of the wafer chuck 50 to rotate the wafer chuck 50, a rail 54b which is coupled to the lower portion of the rotating shaft 54a to provide a route for horizontally driving the wafer chuck 50 and a moving section 54c for moving the wafer chuck 50 by way of the rail 54b. A light source 56 is installed above the peripheral area of the wafer W to generate light. The structure and function of a second driving section 60, which drives the light source 56 such that a predetermined width of the peripheral area of the wafer W is exposed, are identical to those of the second driving section 40 according to the first embodiment of the present invention.

Figure 8:
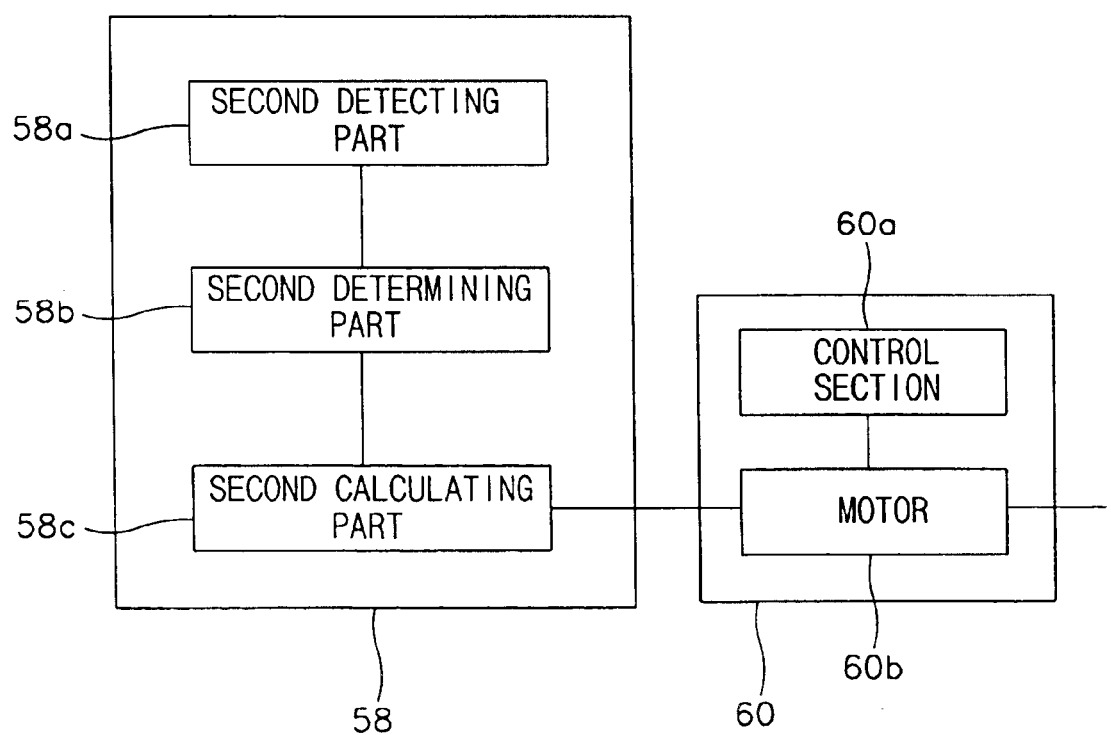
FIG. 8 is a block diagram illustrating the construction of an inspecting section and a second driving section of the apparatus shown in FIG. 7.

In the second embodiment of the present invention, the inspecting section 58 for inspecting whether the light generated from the light source is precisely radiated onto the peripheral area of the wafer W has a structure that is different from the structure of the inspecting section according to the first embodiment of the present invention. FIG. 8 is a block diagram illustrating the construction of the inspecting section 58 and the second driving section 60 of the apparatus shown in FIG. 7.

Referring to FIGS. 7 and 8, the inspecting section 58 includes a second detecting part 58a horizontally remote from an edge portion of the wafer W loaded on the wafer chuck 50 to detect a distance between the edge portion of the wafer W and a reference point that is horizontally positioned with respect to the edge portion of the wafer W. A second determining part 58b is provided to receive the distance datum from the second detecting part 58a and to compare the detected distance datum with a reference distance datum to determine whether the detected distance datum is within a predetermined, allowable range of values. The reference distance datum is a distance between the edge portion of the wafer W and the reference point, which is detected when the predetermined width of the peripheral area of the wafer is uniformly exposed to the light. A second calculating part 58c is operatively associated with the second determining part 58b to precisely calculate the position of the light to be radiated and the position datum of the light source 56 for precisely radiating the light to the position based on an error value of the distance datum obtained by the second determining part 58b.

When the predetermined width of the peripheral area of the wafer W is uniformly exposed, the distance between the edge portion of the wafer W and the reference point is constantly maintained. Therefore, the position datum of the light source 56, which is a distance for moving the light source 56 in an inner or an outer direction of the wafer W to precisely radiate the light to the peripheral area of the wafer W, may be calculated based on the error value of the distance datum.

The second driving section 60 is coupled to a motor 60b to horizontally move the light source 56 in an inner or an outer direction of the wafer W loaded on the wafer chuck 50. In addition, a control section 60a is provided to control the operation of the motor 60b based on the position datum inputted from the inspecting section.

Accordingly, the apparatus according to the second embodiment of the present invention is able to precisely expose the predetermined width of the peripheral area of the wafer W by moving the light source using the second driving section 60.

Hereinafter, a method for exposing the peripheral area of the wafer W using the apparatus according to the second embodiment of the present invention will be described.

Figure 9:
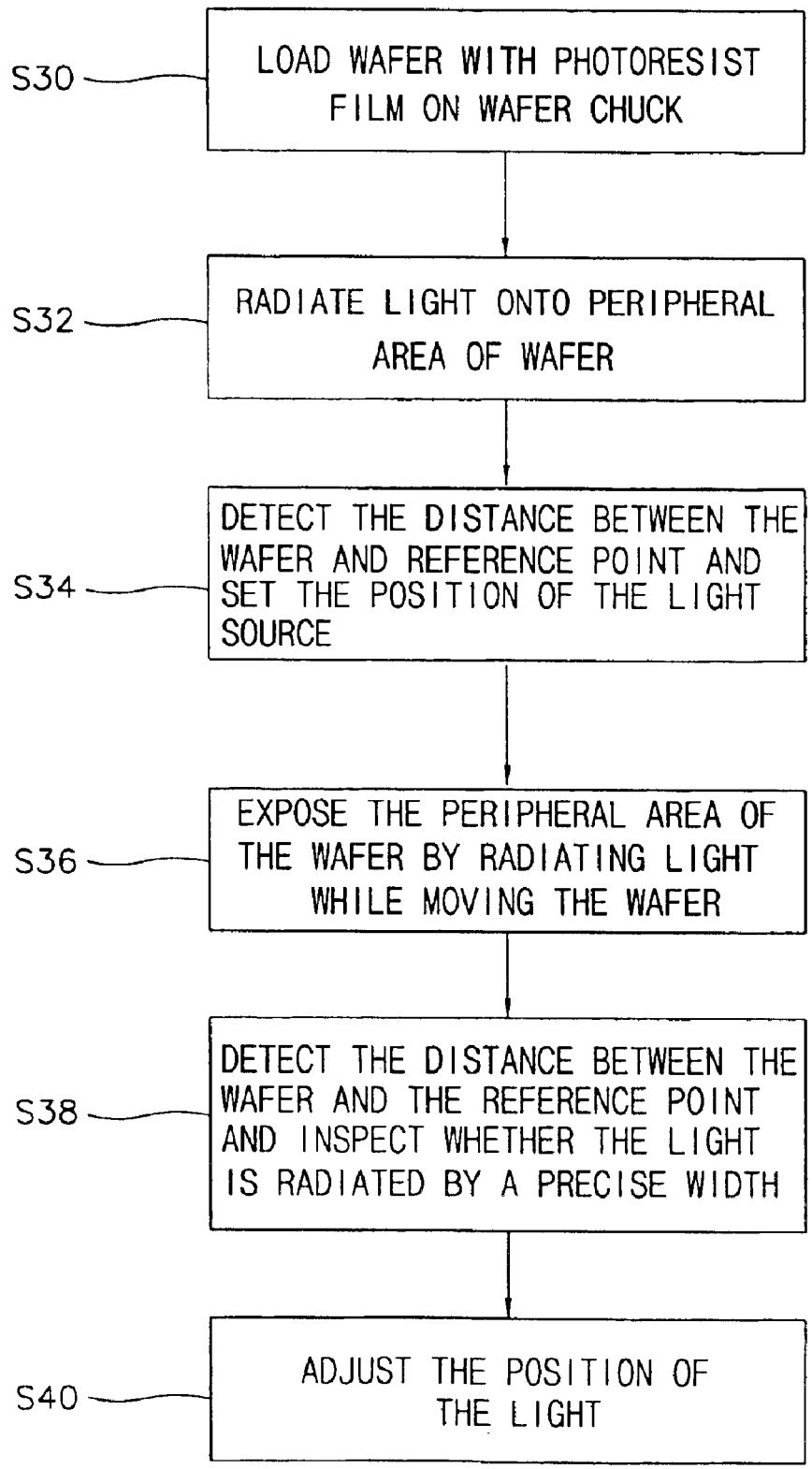
FIG. 9 is a flow chart illustrating method steps for exposing the peripheral area of a wafer according to the second embodiment of the present invention.

FIG. 9 is a flow chart illustrating method steps for exposing the peripheral area of a wafer according to the second embodiment of the present invention.

Referring to FIGS. 7, 8 and 9, the wafer W coated with a photoresist film 52 is loaded on the wafer chuck 50, in step S30.

Then, in step S32, the light is radiated onto a predetermined portion of the peripheral area of the wafer W. The light source 56 is positioned such that only a predetermined width of the peripheral area of the wafer W is exposed to the light when a center of the wafer W matches a center of the wafer chuck 50.

Then, in step S34, the distance between the edge portion of the wafer W loaded on the wafer chuck and the reference point is detected. The detected distance datum is compared with the predetermined reference distance datum to calculate the position datum of the light source 56 and thereby reset, if necessary, the position of the light source 56.

In step S36, the photoresist film 52 formed on the peripheral area of the wafer W is exposed by radiating the light onto the peripheral area of the wafer W while moving the wafer W by driving the wafer chuck 50. The light is radiated over the peripheral area and an outer area beyond an edge portion of the wafer W.

In step S38, when the peripheral area of the wafer W is exposed while driving the wafer chuck 50, the distance between the edge portion of the wafer W and the reference point is detected to inspect whether the light is radiated onto the predetermined width of the peripheral area of the wafer W. More particularly, the second detecting part 58a detects the distance between the edge portion of the wafer W and a reference point that is horizontally spaced from the edge portion of the wafer W. The reference point is positioned on an extension line that is extended from a center of the wafer beyond the edge portion of the wafer W. In addition, the second determining part 58b receives the distance datum from the second detecting part 58a. The second determining part 58b compares the distance datum with the reference distance datum to determine whether the distance datum lies within a predetermined, allowable range of values. The reference distance datum is determined as a distance between the edge portion of the wafer and the reference point that is detected when the predetermined width of the peripheral area of the wafer is uniformly exposed to the light. The second calculating part 58c calculates the precise position datum of the light to be radiated based on the error value inputted from the second determining part 58b. If the detected distance datum is larger than the reference distance datum, the width of the peripheral area of the wafer W, onto which the light is radiated, is narrowed. If the detected distance datum is smaller than the reference distance datum, the width of the peripheral area of the wafer W is extended or widened. Accordingly, in order to radiate the light onto the predetermined width of the peripheral area of the wafer precisely, the distance datum for horizontal movement of the light source 56 in the inner or outer direction of the wafer W is calculated based on the error value obtained by the first determining part 58*b*.

In step S40, if the light radiated onto the peripheral area of the wafer W does not match the predetermined width, the position of the light is adjusted by moving the light source 56. That is, the control section 60*a* of second driving section 60 receives the calculated position datum and drives the motor 60*b* operatively associated with the light source based on the position datum to horizontally move the light source 56 in the inner or outer direction of the wafer W.

Figure 10:
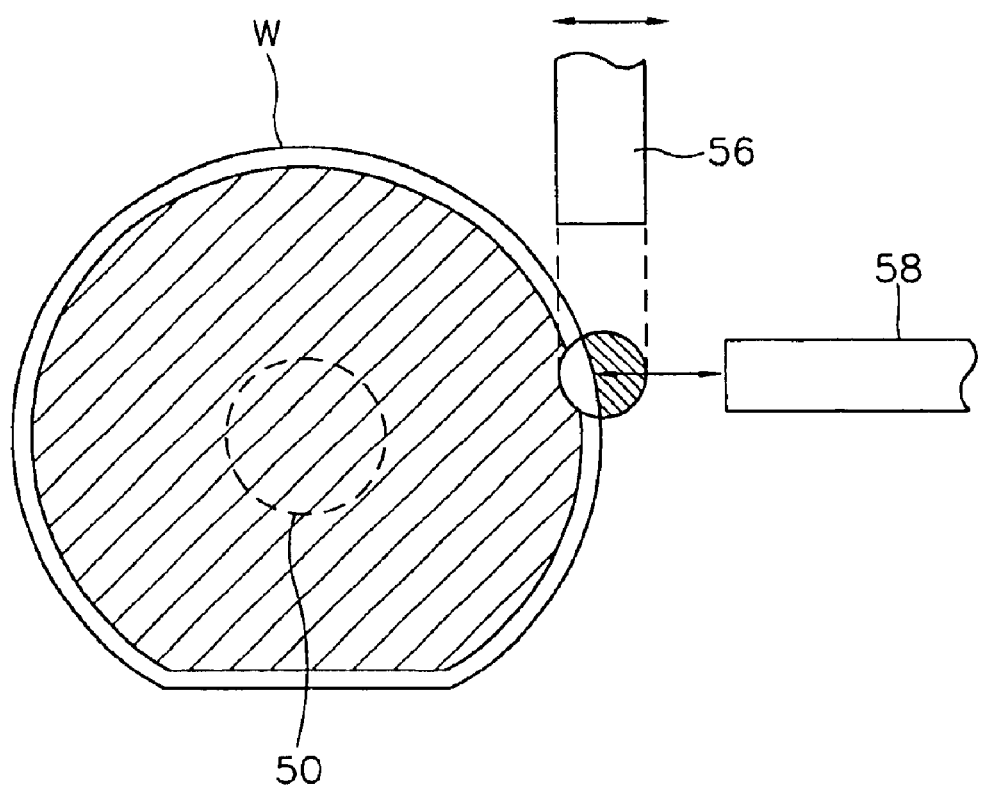
FIG. 10 illustrates a top plan view of a wafer illustrating a method for exposing the peripheral area of the wafer using the apparatus shown in FIG. 7.

FIG. 10 illustrates a top plan view of a wafer illustrating method steps for exposing the peripheral area of the wafer using the apparatus shown in FIG. 7.

Referring to FIG. 10, the wafer chuck 50 is driven to expose the peripheral area of the wafer W loaded thereon while radiating the light from the light source 56 onto the peripheral area of the wafer W. At this time, the distance between the edge portion of the wafer and the predetermined reference point is detected by the inspecting station 58 and the light source 56 is horizontally moved in the inner or outer direction of the wafer W based on the detected distance datum. Accordingly, the predetermined width of the peripheral area of the wafer W may be precisely exposed by moving the light source 56 even when the wafer W is not accurately positioned on the wafer chuck 50 or a tolerance is exceeded when the wafer chuck 50 is rotated.

As described above, according to the present invention, the position of the light may be adjusted by inspecting whether the light is precisely radiated onto the peripheral area of the wafer, in order that the predetermined width of the peripheral area of the wafer may be precisely exposed. Accordingly, faulty exposure of the wafer, which occurs when the predetermined width of the wafer to be exposed to the light is irregularly formed, may be prevented, thereby increasing the production yield of the semiconductor device.

While the present invention has been described in detail with reference to preferred embodiments thereof, it should be understood by those of ordinary skill in the art that various changes, substitutions and modifications may be made hereto without departing from the scope of the invention as defined in the following claims.

What is claimed is:

1. A method for exposing a peripheral area of a wafer, comprising:
   (i) exposing a photoresist film formed on a peripheral area of a wafer by radiating a light toward the peripheral area of the wafer while moving the wafer;
   (ii) inspecting whether the light is uniformly radiated onto a predetermined width of the peripheral area of the wafer during (i); and
   (iii) adjusting a position of the light to be radiated onto the peripheral area of the wafer during (i) if the light deviates from the predetermined width of the peripheral area of the wafer.

2. The method as claimed in claim 1, wherein, in (i), the wafer is moved in a direction parallel to a flat zone of the wafer when the light is radiated onto the flat zone of the wafer and the wafer is horizontally rotated when the light is radiated onto the peripheral area of the wafer.

3. The method as claimed in claim 1, wherein, in (i), the light is radiated over the peripheral area and an outer area beyond an edge portion of the wafer.

4. The method as claimed in claim 1, wherein (ii) comprises:
   a) detecting the light radiated to an outer area beyond an edge portion of the wafer and outputting an optical datum thereof;
   b) comparing the outputted optical datum with a reference optical datum to determine whether the outputted optical datum is within a predetermined, allowable range of values; and
   c) calculating a position datum for the light to be radiated based on an error value between the reference optical datum and the outputted optical datum.

5. The method as claimed in claim 4, wherein the optical datum is an intensity of radiation of the light detected by a light detecting section.

6. The method as claimed in claim 4, wherein the reference optical datum is an optical datum that is detected when the predetermined width of the peripheral area of the wafer is uniformly exposed to light.

7. The method as claimed in claim 1, wherein, prior to (i), an error value between a distance datum from an edge portion of the wafer to a light detecting section and a reference distance datum is obtained, and a position datum for the light to be radiated is calculated to compensate for the position of the light.

8. The method as claimed in claim 1, wherein, in (iii), the position of the light is moved to an inner portion or an outer portion of the wafer based on a position datum of the light inspected in (ii).

9. A method for exposing a peripheral area of a wafer, comprising:
   (i) exposing a photoresist film formed on a peripheral area of a wafer by radiating a light toward the peripheral area of the wafer while moving the wafer;
   (ii) inspecting whether the light is uniformly radiated onto a predetermined width of the peripheral area of the wafer during (i) based on measuring a distance between an edge portion of the wafer, which includes a portion exposed to the light, to a reference point, which is positioned on an extension line extended from a center of the wafer beyond the edge portion of the wafer, and comparing the distance with a reference distance to determine whether the distance is within an allowable range of values; and
   (iii) adjusting a position of the light to be radiated onto the peripheral area of the wafer during (i) if the light deviates by more than the allowable range of values from the predetermined width of the peripheral area of the wafer.

10. The method as claimed in claim 9, wherein the reference distance is determined as a distance between the edge portion of the wafer and the reference point, which is detected when the predetermined width of the peripheral area of the wafer is uniformly exposed to the light.

* * * * *